United States Patent [19]

Bindra et al.

[11] Patent Number: 4,910,049
[45] Date of Patent: Mar. 20, 1990

[54] CONDITIONING A DIELECTRIC SUBSTRATE FOR PLATING THEREON

[75] Inventors: Perminder S. Bindra, Johnson City, N.Y.; Donald F. Canaperi, Bridgewater, Conn.; Allan P. David, Binghamton, N.Y.; David N. Light, Friendsville, Pa.

[73] Assignee: International Business Machines Corporation, Armonk, N.Y.

[21] Appl. No.: 941,467

[22] Filed: Dec. 15, 1986

[51] Int. Cl.⁴ .............................................. B05D 3/04
[52] U.S. Cl. ................................... 427/305; 427/98;
427/304; 437/230; 156/279; 156/307.3
[58] Field of Search ...................... 427/92, 97, 98, 304,
427/305; 428/404; 437/230; 156/279, 307.3

[56] References Cited

U.S. PATENT DOCUMENTS

| | | | |
|---|---|---|---|
| 3,009,608 | 11/1961 | Lew | 222/364 |
| 3,488,799 | 1/1970 | Danielsson | 17/52 |
| 3,576,662 | 4/1971 | Diebold | 427/305 |
| 3,632,436 | 1/1972 | Denning | 427/92 |
| 4,037,014 | 7/1977 | Gittleman | 428/404 |
| 4,162,337 | 7/1979 | D'Asaro et al. | 427/92 |
| 4,259,409 | 3/1981 | Arnold | 428/428 |
| 4,281,038 | 7/1981 | Ambros | 428/404 |
| 4,297,393 | 10/1981 | Denning | 427/92 |
| 4,321,283 | 3/1982 | Patel | 427/376.3 |
| 4,359,485 | 11/1982 | Donnelly et al. | 427/53.1 |
| 4,396,485 | 1/1983 | Gordon | 427/126.6 |
| 4,401,840 | 8/1983 | Chitre | 427/92 |
| 4,404,237 | 9/1983 | Eichelberger et al. | 427/96 |
| 4,425,378 | 1/1984 | Maher | 427/79 |
| 4,448,804 | 5/1984 | Amelio | 427/322 |
| 4,486,813 | 12/1984 | Maher | 361/321 |
| 4,582,564 | 4/1986 | Shanefield | 427/98 |
| 4,644,638 | 2/1987 | Switzer | 427/74 |

FOREIGN PATENT DOCUMENTS

| | | | |
|---|---|---|---|
| 0066330 | 12/1982 | European Pat. Off. | 427/97 |
| 57-94563 | 6/1982 | Japan | 427/443.1 |
| 57-114328 | 7/1982 | Japan | 427/92 |
| 57-114672 | 7/1982 | Japan | 427/92 |

OTHER PUBLICATIONS

Saubestre, "Electroless Plating Today", Metal Finishing, Jul. 1962, pp. 49–53.
Ballas, "Electrolessly Plating Alloys", IBM TDR, vol. 16, No. 4, 9–1973, p. 1039.

*Primary Examiner*—Shrive Beck
*Assistant Examiner*—Vi Duong Dang
*Attorney, Agent, or Firm*—Pollock, Vande Sande & Priddy

[57] ABSTRACT

A dielectric substrate is conditioned for plating from an electroless metal plating bath by providing the surface or surfaces of the substrate that are to be plated with semiconductor material whereby the semiconductor material, in the case of n-type material, exhibits energy band where the valence band is equal to or higher than and, in the case of p-type material, exhibits energy band where the valence band is equal to or lower than the redox potential of the metallic ions in the electroless plating bath that are to be deposited as metal on the substrate.

11 Claims, 3 Drawing Sheets

CONDITIONING A DIELECTRIC SUBSTRATE FOR PLATING THEREON

TECHNICAL FIELD

The present invention is concerned with conditioning a dielectric material and is particularly concerned with treating a dielectric substrate to prepare the substrate for subsequent plating of metal thereon from an electroless metal plating bath. The conditioning can be in the holes and/or on the surfaces of the substrate.

The present invention finds particular applicability in the manufacture of printed circuit cards and boards.

BACKGROUND ART

In the manufacture of printed circuit cards and boards a dielectric sheet material is employed as the substrate. A conductive circuit pattern is provided on one or both of the major surfaces of the substrate.

A conductive pattern can be formed on the surface of a substrate using a variety of known techniques. These known techniques include the subtractive technique where a layer of copper is etched to form the desired circuit pattern, the EDB (electroless direct bond) technique where copper is electrolessly plated directly on the surface of the substrate in the desired pattern, the peel-apart technique where the desired circuit pattern is plated up from a thin layer of peel-apart copper.

In addition, connections between layers are made by means of plated through-holes or vias. In plating such holes, copper must be plated directly on the dielectric substrate (on the walls of the holes or vias). In addition, if one employs the EDB technique, it is necessary to plate directly on the surface of the substrate.

Since the dielectric substrate is non-conductive, in order to plate on the substrate (either on the walls of the holes or on the surface of the substrate) the substrate must be catalyzed prior to the deposition of metal onto the substrate in order to render it susceptible to being plated by an electroless plating technique.

Among the more widely employed procedures for catalyzing a substrate is the use of a stannous chloride sensitizing solution and a palladium chloride activator to form a layer of metallic palladium particles thereon.

For instance, one method for catalyzing a dielectric substrate is exemplified by U.S. Patent 3,011,920 which includes sensitizing the substrate by first treating it with a solution of a colloidal metal, accelerating the treatment with a selective solvent to remove protective colloids from the sensitized dielectric substrate, and then electrolessly depositing a metal coating on the sensitized substrate; for example, with copper from a solution of a copper salt and a reducing agent.

Also, as suggested in U.S. Pat. No. 3,099,608, a dielectric substrate can be pretreated by depositing a thin film of a "conductivator" type of metal particle, such as palladium metal, from a semicolloidal solution onto the dielectric substrate to provide a conducting base that permits electroplating with conductive metal on the conductivated base.

U.S. Pat. No. 4,066,809 discloses the use of a so-called "triple seeding" technique which includes contacting the surface of the dielectric material with an aqueous stannous chloride sensitizing solution followed by contacting the surfaces of the dielectric material with an aqueous palladium chloride activator solution and then followed by contacting the surfaces of the dielectric material with an aqueous palladium chloride/stannous chloride/hydrochloric acid seeder bath.

As can be appreciated, although the prior art methods of sensitizing or conditioning a dielectric substrate for subsequent plating from an electroless metal plating bath are adequate for the most part, they require a multi-stepped process (e.g., sensitizing the substrate and then activation of the sensitizing materials, such as the stannous compound, by reaction with a palladium compound or the like).

Moreover, the prior art methods have been somewhat limited in the particular combination of metals that provide adequate results. The prior art has also been somewhat restrictive in the actual form by which the metallic materials could be successfully applied to the desired substrate.

SUMMARY OF THE INVENTION

The process of the present invention makes it possible to eliminate the required activating step employed in prior art processes for conditioning dielectric substrates for electroless metal plating.

The process of the present invention makes it possible to simplify the conditioning of a dielectric substrate to render it capable of having deposited thereon a metal from an electroless metal plating bath.

In particular, the process of the present invention is concerned with conditioning a dielectric substrate for plating from an electroless metal plating bath by providing a semiconductor material on the surface or surfaces of the substrate that are to be subsequently plated. The semiconductor material employed in the case of an n-type material must exhibit an energy band where the valence band is at least equal to or preferably higher than and, in the case of a p-type material, must exhibit an energy band where the valence band is at least equal to or preferably lower than the redox potential of the metallic ions in the electroless plating bath to be employed to provide the subsequent metal deposit on the substrate.

BEST AND VARIOUS EMBODIMENTS FOR CARRYING OUT THE INVENTION

Figure 1:
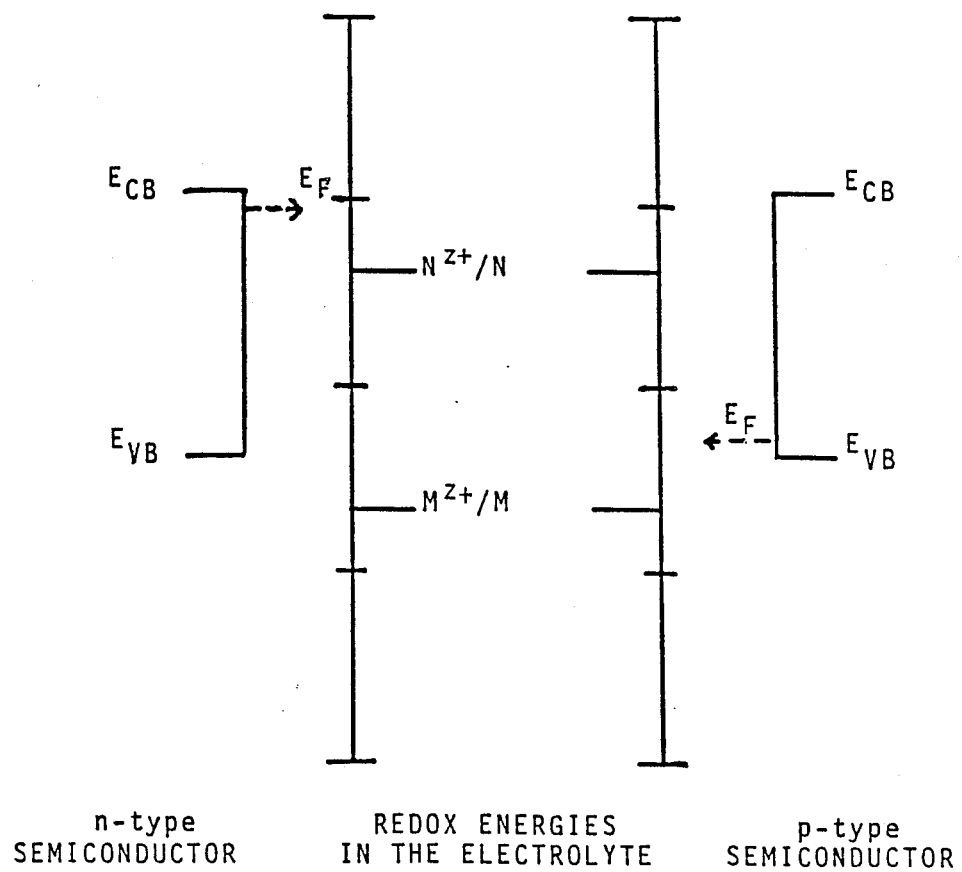
FIGS. 1–3 are energy diagrams illustrating energy levels and redox potentials.

The process of the present invention is applicable to treating or conditioning a wide variety of dielectric (non-conductor) substrates. Dielectric substrates including thermoplastic, thermosetting resins, and glass may be treated in accordance with the present invention.

Typical thermosetting polymeric materials include epoxy, phenolic-based materials, polyamides, and polyimides.

The dielectric materials may be molded articles of the polymers containing fillers and/or reinforcing agents such as glass-filled epoxy or phenolic-based materials. Examples of some phenolic-type materials include copolymers of phenol, resorcinol, and cresol.

Examples of some suitable thermoplastic polymeric materials include polyolefins such as polypropylene, polysulfones, polycarbonates, nitrile rubbers, and ABS polymers.

The most typical polymers employed for purposes of preparing printed circuit cards and boards are the epoxy resins. Typical epoxy resins include the bisphenol A type resins obtained from bisphenol A and epichlorohydrin, resinous materials obtained by the epoxidation of novolak resins produced from a phenolic material such as phenol and an aldehyde such as formaldehyde with epichlorohydrin, polyfunctional epoxy resins such as tetraglycidyldiaminodiphenyl methane, alicyclic epoxy resins such as bi (3,4-epoxy-6-methylcyclohexamethyl) adipate. The most usual epoxy employed is of the bisphenol A type.

Also, the resinous epoxy compositions can contain accelerating agents and curing agents, as well-known in the art. Examples of suitable curing agents include polyamines, primary, secondary, and tertiary amines, polyamides, polysulfones, urea-phenol-formaldehyde, and acids or anhydrides thereof. In addition, suitable curing agents include Lewis acid catalysts such as $BF_3$ and complexes thereof.

The dielectric substrate usually contains fillers and/or reinforcing fibers such as glass fibers. Such compositions containing fibers are usually prepared by impregnating the fibers with the epoxy composition. The amount of the epoxy composition when combined with the fibers is usually about 30% to about 70% by weight and more usually about 55% to about 65% by weight of the total of the solids of the epoxy composition and the fiber.

After combining with the reinforcing fibers, the composition is cured to the B-stage and molded to the desired shape, such as a sheet. When sheets are employed, the thickness is usually about 1.5 mils to about 8 mils and more usually about 2 mils to about 3 mils. The curing of the B-stage is generally achieved by using temperatures of about 80° C. to about 110° C. and for times of about 3 minutes to about 10 minutes.

The substrate can then be laminated onto another supporting substrate as is generally practiced. For instance, the bonding of substrates can be carried out by pressing together a number of sheets in the substrate in a pre-heated laminating press at a predetermined pressure and temperature as, for example, about 200 psi to about 500 psi and more usually about 250 psi to about 300 psi and at about 180° C. The time of the pressing operation is variable, depending upon the particular materials employed and the pressures applied. About one hour is adequate for the above conditions.

The term "surface" as employed herein refers to the surfaces inside through-holes or vias, as well as the major surfaces of the substrate. For instance, the present invention is useful for conditioning the plated through-holes where the circuitry is being applied by either additively plating upon a thin layer of peel-apart copper or by a subtractive process. Also, the present invention is useful for conditioning in a solution where an EDB is being used. In this case, the circuitry is additively plated both in the holes and over the surface of the substrate and those areas where desired.

Prior to the initiation of the process of the present invention for treating the dielectric substrate, the required through-holes in the substrate are made in the dielectric with the through-holes being suitably cleaned and preconditioned. For instance, the preconditioning can include creation of active sites by physical means such as the sacrificial foil technique, sand, and/or vapor blasting and/or chemical means such as solvent swelling. A typical solvent is N-methyl pyrrolidone. The substrate can also be pretreated with a sulfochromic acid composition.

In accordance with the present invention, the surface or surfaces of the substrate that are to be subsequently plated from an electroless metal plating bath are provided with semiconductor material. It is essential to the practice of the present invention that the semiconductor material employed when it is an n-type material exhibits an energy band where the valence band is at least equal to and preferably higher than the redox potential of the metallic ions of the electroless metal plating bath that are to be plated onto the surfaces of the substrate. When the semiconductor material employed is a p-type material it is essential to the practice of the present invention that it exhibits an energy band where the valence band is at least equal and preferably lower than the redox potential of the metallic ions of the electroless metal plating bath that are to be plated onto the surfaces of the substrate.

Figure 2:
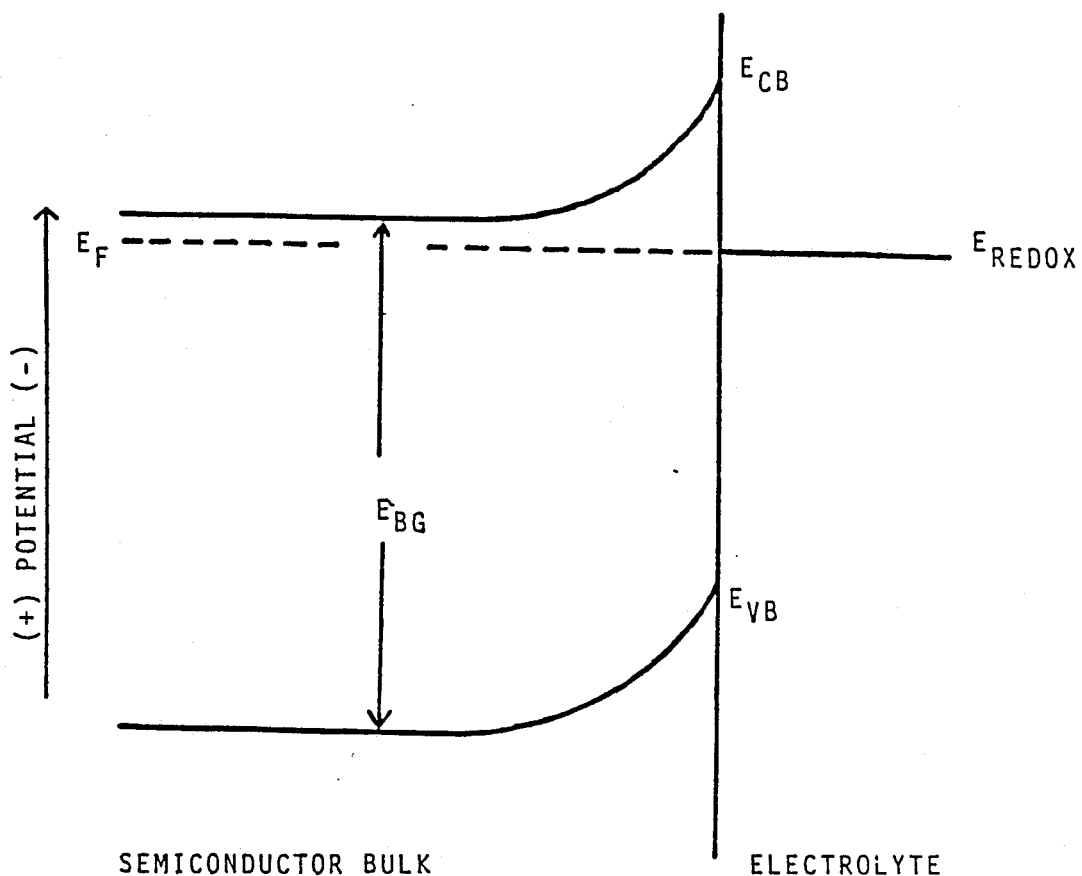
Figure 3:
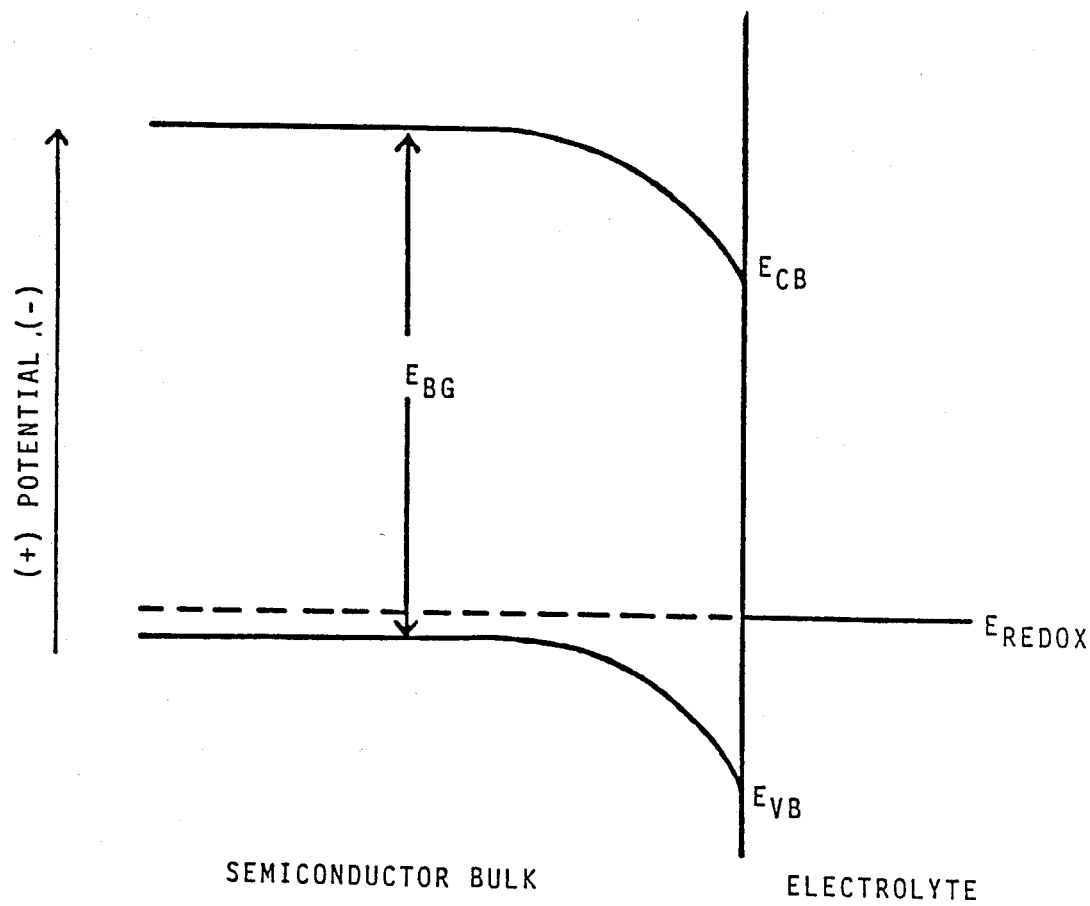

Reference to FIGS. 1-3 illustrate what is believed to be the mechanism involved with respect to the present invention. For instance, the energy level diagram for n-type and p-type semiconductors and an electrolyte prior to contact is shown in FIG. 1, where the energy levels are described in volts versus a reference electrode.

In FIG. 1, EF is the Fermi level of the semiconductor, $E_{cb}$ and $E_{vb}$ are the conduction and valence band positions, respectively, $E_{bg}$ is the semiconductor band gap, and $M^{z+}/M$ and $N^{z+}/N$ are the redox potentials of two metal ion/metal systems in the electrolyte.

Redox potentials in electrolytes can be shown to be equivalent to Fermi levels in metals or semiconductors. When the n-type semiconductor is immersed in an electrolyte containing the $M^{z+}/M$ redox system, there is equilibration of the two Fermi levels by appropriate charge transfer and the energetics of the interphase at equilibrium is as illustrated in FIG. 2. The thermodynamic equilibration is achieved by spontaneous hole injection from metal ions into the valence band of the semiconductor. Since this is a currentless deposition, it requires a counter-anodic reaction. However, if the standard potential for anodic dissolution of the semiconductor $E_d{}^O$ is more negative than the redox potential, $E_{redox}$, then the anodic reaction involves the dissolution of the semiconductor.

When a p-type semiconductor is immersed in an electrolyte containing the $N^{z+}/N$ redox system, the energetics of the interface are as illustrated in FIG. 3. In this situation, metal deposition occurs via minority carrier ($e^-$) interfacial transfer to metal ions in solution. If the anodic semiconductor dissolution $E_d{}^O$ is more negative than $E_{redox}$, then the anodic reaction is the dissolution of the semiconductor.

Examples of semiconductors include doped silicon, doped polycrystalline silicon, doped germanium, doped Group III-V intermetallic compounds such as gallium arsenide and indium antimonide, doped Group II-VI intermetallic compounds, and titanium dioxide. P-type dopants for silicon include aluminum, gallium, and indium. N-type dopants for silicon include phosphorus and arsenic or antimony. Examples of some n-type impurities employed for indium antimonide are lithium, tin, silicon, selenium, and tellurium. Examples of some p-type impurities for indium antimonide are zinc, cadmium, magnesium, manganese, and mercury. N-type dopant for gallium arsenide is silicon and a p-type dopant for gallium arsenide is zinc. N-type dopants for germanium are arsenic and antimony. P-type dopants for germanium are zinc and cadmium.

The semiconductor can be provided on the surface or surfaces of the substrate to be plated by any of a number of techniques such as coating the surface or surfaces with a slurry of semiconductor particles, sputter coating the substrate with a target of the semiconductor material, or any other well-known method of coating. Moreover, if desired, the semiconductor material in the formation of the substrate itself, so that semiconductor particles during, for instance, the lamination, are included therein and when through-holes are provided will be on the surfaces of the throughholes. Methods of coating are well-known in the art. A detailed discussion of them is not deemed necessary.

The particle size of the particles is usually less than about 2½ microns and preferably about 0.5-2 microns.

Examples of some suitable combinations of semiconductor material and metal that can be plated thereon include silicon or polycrystalline silicon as the semiconductor material and palladium, silver, and copper as the metal; gallium arsenide as the semiconductor material and silver and palladium as the metal to be plated thereon. Particular combinations of semiconductor materials to be employed for any particular desired metal to plate onto the substrate can be determined by persons skilled in the art without undue experimentation once aware of the present invention and disclosure.

After the substrate is provided with the desired semiconductor material in accordance with the present invention, the desired metal is plated onto the treated surface or surfaces from an electroless plating bath. The metal is then coated to a desired thickness. Typical metals for producing integrated circuit boards and cards include nickel and copper. Typical copper electroless plating baths and their method of application are disclosed in U.S. Pat. Nos. 3,844,799 and 4,152,467, disclosures of which are incorporated herein by reference.

The copper electroless plating bath is generally an aqueous composition which includes a source of cupric ion, a reducing agent, a complexing agent for the cupric ion, and a pH adjustor. The plating baths also preferably include a cyanide ion source and a surface-active agent.

The cupric ion source generally uses a cupric sulfate or a cupric salt of the complexing agent to be employed. When employing cupric sulfate, it is typical to use amounts from about 3 to about 15 grams/liter and most typically from about 8 to about 12 grams/liter. The most common reducing agent employed is formaldehyde which is generally used in amounts from about 0.7 to about 7 grams/liter and most preferably from about 0.7 to about 2.2 grams/liter. Examples of some other reducing agents include formaldehyde precursors or derivatives such as paraformaldehyde, trioxane, dimethylhydantoin, glyoxal; borohydrides such as alkali metal borohydrides (sodium and potassium borohydride) and substituted borohydride such as sodium trimethoxy borohydride; boranes such as amine boranes (isopropyl amine borane and morpholine borane). Hypophosphite reducing agents can also be used for electroless nickel and copper plating.

Examples of some suitable complexing agents include Rochelle salts, ethylenediamine tetraacetic acid, the sodium (mono-, di-, tri-, and tetra-sodium) salts of ethylenediamine tetraacetic acid, nitrilo tetraacetic acid and its alkali salts, gluconic acid, gluconates, triethanol amine, glucono-(gamma)-lactone, modified ethylenediamine triacetate, the amount of complexing agent is dependent upon the amount of cupric ions present in the solution and is generally from about 20 to about 50 grams/liter or in an about three-four fold molar excess.

The plating bath can also contain a surfactant that assists in wetting the surface to be coated. A satisfactory surfactant is, for instance, an organic phosphate ester available under the trade designation Gafac RE-610. Generally, the surfactant is present in amounts from about 0.02 to about 0.3 grams/liter.

In addition, the pH in the bath is also generally controlled, for instance, by the addition of a basic compound such as sodium hydroxide or potassium hydroxide in the desired amount to achieve the desired pH. The usual pH of the electroless plating bath is between about 11.6 and 11.8.

Also, the bath can contain a cyanide ion, about 10 to about 25 milligrams/liter to provide a cyanide ion concentration in the bath within the range of 0.0002 to 0.0004 molar. Examples of some cyanides which can be employed according to the present invention are the alkali metal, alkaline earth metal, and ammonium cyanides. Moreover, the plating baths can include other minor additives as known in the art.

The plating baths generally employed have a specific gravity within the range of 1.060 to 1.080. In addition, the temperature of the bath is usually maintained between about 70° C. and about 80° C. and most usually between about 70° C. and about 75° C.

In addition, if desired, the plating with the copper can be carried out employing dual plating bath techniques such as those suggested along the lines suggested in U.S. Pat. Nos. 4,448,804 and 4,525,390, disclosures of which are incorporated herein by reference.

The following non-limiting examples are presented to further illustrate the present invention.

EXAMPLE 1

An epoxy-glass fiber prepreg is dip-coated into a methanol suspension of particulate-silicon having an average particle size of about 2.5μm in methanol. The particulate n-type silicon is obtained by ball milling crushed single crystal wafers of n-type silicon. The methanol suspension is obtained by adding methanol to the particulate n-type silicon to provide a dense suspension containing about 2 to 4 grams of the particulate n-type silicon. The epoxy-glass fiber prepreg is maintained in the methanol suspension for about 0.5 to about 2 minutes. After removing such, the boards are dried, leaving a layer of n-type silicon particles on the surfaces of the prepreg. The substrate is then immersed in a copper electroless additive plating bath for about 45 minutes. The electroless plating bath contains about 10 grams/liter of $CuSO_4 \cdot 5H_2O$, 35 grams/liter of ethylenediamine tetraacetic acid dihydrate, about 0.25 grams/liter of Gafac RE-610, about 14 milligrams/liter of sodium cyanide, and about 2 milliliters/liter of 37% aqueous formaldehyde. The specific gravity of the plating bath is about 1.07, the pH is 11.7 by the addition of NaOH and the temperature of the bath is about 73° C.±5° C. The oxygen content of the bath is maintained at about 2.5 to about 3.5 ppm. The gas flow rate of oxygen into the bath is about 12 SCFM.

Substrates are removed from the plating bath and dried. The presence of copper on the substrate is clearly visible to the naked eye, demonstrating the plating of the copper thereon.

EXAMPLE 2

Example 1 is repeated, except that prior to the contacting with the electroless copper plating bath, the substrates are immersed in a solution of palladium ions containing about 1% to 3% of HF followed by the plating in the copper plating bath. The palladium particles are about 1500 to about 2000 angstroms. The results achieved are similar to those of Example 1, except that the take time for providing the copper coating on the substrate with the assistance of the palladium being present is reduced to about 1/10th the time as achieved for the procedure of Example 1.

EXAMPLE 3

Example 1 is repeated, except that the silicon is coated onto the epoxy-glass fiber prepreg by sputtering in place of the methanol solution. The silicon is sputtered onto the epoxy-glass fiber prepreg in an argon gas at a rate of about 130 angstroms/minute per geometric area of the substrate. The amount of silicon deposited is about 450 to 1000 angstroms. The results obtained are similar to those of Example 1.

EXAMPLE 4

Example 2 is repeated, except that the silicon is provided onto the epoxy-glass fiber prepreg by sputtering in an argon gas at a rate of about 130 angstroms/minute. The results achieved are similar to those of Example 2.

Having thus described our invention, what we claim as new and desire to secure by Letters Patent is:

1. Process for plating a dielectric substrate which comprises:
   providing the surface of said substrate that is to be subsequently plated with particles of semiconductor material; wherein said particles are included during the formation of said substrate by lamination and wherein;
   said semiconductor material in the case of n-type material exhibits an energy band where the valence band is at least equal to or higher than and, in the case of p-type material, exhibits an energy band where the valence band is at least equal to or lower than the redox potential of the metallic ions in an electroless metal plating bath that are to be subsequently plated as metal on said dielectric substrate; and
   then contacting with an electroless metal plating bath containing said metallic ions, thereby depositing said metal on said surfaces of said substrate.

2. The process of claim 1 wherein said semiconductor material is n-type material that exhibits an energy band where the valence band is higher than the redox potential of the metallic ions in said electroless metal plating bath that are to be subsequently plated as metal on said dielectric substrate.

3. The process of claim 1 wherein said semiconductor material is p-type material that exhibits an energy band where the valence band is lower than the redox potential of the metallic ions in said electroless metal plating bath that are to be subsequently plated as metal on said dielectric substrate.

4. The process of claim 1 wherein said dielectric substrate is an epoxy-containing substrate.

5. The process of claim 1 wherein said metallic ions are copper ions.

6. The process of claim 1 wherein said metallic ions are palladium ions.

7. The process of claim 1 wherein said semiconductor material is doped silicon.

8. The process of claim 5 wherein said semiconductor material is doped silicon.

9. The process of claim 1 wherein the particle size of said semiconductor particles is less than about 2½ micron.

10. The process of claim 1 wherein the particle size of said particles is about 0.5-2 microns.

11. The process of claim 1 wherein said substrate includes through-holes having said particles on the surfaces thereof.

* * * * *